(12) United States Patent
Lutz (10) Patent No.: US 8,685,816 B2
(45) Date of Patent: Apr. 1, 2014

(54) METHODS OF FORMING SEMICONDUCTOR DEVICES BY FORMING SEMICONDUCTOR CHANNEL REGION MATERIALS PRIOR TO FORMING ISOLATION STRUCTURES

(75) Inventor: Robert C. Lutz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/493,003

(22) Filed: Jun. 11, 2012

(65) Prior Publication Data

US 2013/0330907 A1    Dec. 12, 2013

(51) Int. Cl.
*H01L 21/00* (2006.01)

(52) U.S. Cl.
USPC ............... 438/222; 438/218; 257/E21.09

(58) Field of Classification Search
USPC .................... 438/207, 218, 245, 294
See application file for complete search history.

(56) References Cited

U.S. PATENT DOCUMENTS

| | | | |
|---|---|---|---|
| 5,073,516 A * | 12/1991 | Moslehi | 438/429 |
| 6,015,744 A * | 1/2000 | Tseng | 438/401 |
| 6,492,216 B1 | 12/2002 | Yeo et al. | |
| 6,882,025 B2 * | 4/2005 | Yeo et al. | 257/510 |
| 7,208,362 B2 | 4/2007 | Chidambaram | |
| 7,208,754 B2 * | 4/2007 | Ge et al. | 257/19 |
| 7,321,144 B2 * | 1/2008 | Oh et al. | 257/296 |
| 7,339,215 B2 | 3/2008 | Chidambaram | |
| 7,575,964 B2 * | 8/2009 | Oh et al. | 438/149 |
| 7,622,357 B2 * | 11/2009 | Vaed et al. | 438/309 |
| 7,670,932 B2 * | 3/2010 | Zhu et al. | 438/481 |
| 7,781,278 B2 * | 8/2010 | Zhu | 438/199 |
| 7,935,593 B2 * | 5/2011 | Yang et al. | 438/231 |
| 7,993,999 B2 * | 8/2011 | Basker et al. | 438/199 |
| 8,017,489 B2 | 9/2011 | Clark, Jr. et al. | |
| 8,048,791 B2 * | 11/2011 | Hargrove et al. | 438/591 |
| 8,053,301 B2 | 11/2011 | Jaeger et al. | |
| 8,084,329 B2 * | 12/2011 | Arnold et al. | 438/285 |
| 8,173,524 B1 * | 5/2012 | Chakravarti et al. | 438/481 |
| 8,217,470 B2 | 7/2012 | Chen et al. | |
| 8,222,701 B2 | 7/2012 | Shima | |
| 8,232,186 B2 | 7/2012 | Harley et al. | |
| 2006/0189109 A1 * | 8/2006 | Fitzgerald | 438/586 |
| 2006/0197154 A1 * | 9/2006 | Pelella et al. | 257/347 |
| 2008/0185676 A1 * | 8/2008 | Seo | 257/510 |
| 2010/0181639 A1 * | 7/2010 | Huang et al. | 257/506 |
| 2010/0224938 A1 | 9/2010 | Zhu | |
| 2011/0006349 A1 | 1/2011 | Ota et al. | |

\* cited by examiner

*Primary Examiner* — Scott B Geyer
*Assistant Examiner* — Evren Seven
(74) *Attorney, Agent, or Firm* — Amerson Law Firm, PLLC (57) ABSTRACT

One example of a method disclosed herein for forming a transistor surrounded by an isolation structure includes the steps of, prior to forming the isolation structure, forming a semiconductor material on a region of a semiconducting substrate, after forming the semiconductor material, forming the isolation structure in the substrate around the semiconductor material, and forming a gate structure above the semiconductor material.

27 Claims, 7 Drawing Sheets

METHODS OF FORMING SEMICONDUCTOR DEVICES BY FORMING SEMICONDUCTOR CHANNEL REGION MATERIALS PRIOR TO FORMING ISOLATION STRUCTURES

BACKGROUND OF THE INVENTION

1. Field of the Invention

Generally, the present disclosure relates to the manufacture of sophisticated semiconductor devices, and, more specifically, to various methods of forming semiconductor devices by forming semiconductor channel region materials prior to forming isolation structures, such as trench isolation structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. Such STI structures are typically the very first structures that are formed when manufacturing semiconductor devices.

One technique used to form STI structures initially involves growing a thin pad oxide layer on the substrate and depositing a pad nitride layer on the pad oxide layer. Thereafter, using traditional photolithography and etching processes, the pad oxide layer and the pad nitride layer are patterned. Then, an etching process is performed to form a trench in the substrate for the STI structure using the patterned pad oxide layer and pad nitride layer as an etch mask. Thereafter, a deposition process, such as the well-known High Aspect Ratio Process (HARP) offered by Applied Materials, is performed to overfill the trenches with an insulating material such as silicon dioxide. The deposited silicon dioxide material is then typically densified by subjecting it to an anneal process in a furnace, e.g., about 1000° C. for a duration of about 30 minutes. The purpose of the densification process is to increase the etch resistance of the silicon dioxide material to later wet etching processes. Thereafter, a chemical mechanical polishing (CMP) process is performed using the pad nitride layer as a polish stop layer to remove the excess insulation material positioned outside of the trenches. Then, a subsequent deglazing (etching) process may be performed to insure that the silicon dioxide insulating material is removed from the surface of the pad nitride layer. This deglaze process may remove some of the material of the STI structures. Thereafter, a wet nitride strip process, e.g., a hot phosphoric acid process, is performed to selectively remove the pad nitride layer relative to the pad oxide layer and the STI structure. If desired, the pad oxide layer may also be removed at this time by performing a quick wet etching process using a dilute HF chemistry. Alternatively, the pad oxide layer may be left in place or removed at a later point in the process flow.

Numerous processing operations are performed in a very detailed sequence, or process flow, to form integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. The attacks are not uniform across the surface of the STI structure due to, for example, masking only certain portions of the STI structure during some etching processes. As a result, there is an uneven loss of material in the STI structure, sometimes referred to as "divots." Uneven STI structures can be problematic for several reasons. For example, the uneven topography of such STI structures can make it more difficult for lithographic processes to achieve sufficient focus and pattern resolution. Additionally, if the depth of the divots is too great, the chances that there may be a loss of gate encapsulation as processing continue may occur. The presence of such divots may also cause an increase in the degree of undesirable "footing" of the gate materials when they are patterned to define the gate structure. In some cases, the depth of the divots may be so great that there is a risk of incomplete etching of one or more of the conductive materials in the gate structure such that there is a short circuit created between adjacent gate structures. Such a situation is sometimes referred to as the creation of undesirable "poly stringers" between adjacent gate structures. As a result, the STI structures may not perform their isolation function as intended, which may result in problems such as increased leakage currents, device failure, etc.

One illustrative situation where divots may be created in STI structures involves the formation of NFET and PFET transistor devices on the same substrate, i.e., CMOS (complementary metal oxide semiconductor) technology, due to different materials and construction techniques used in forming the two different types of devices. Typically, manufacturing integrated circuit devices using CMOS technology involves many masking operations wherein one of the device regions is masked, e.g., the N-active region, while the other region, e.g., the P-active region, is subjected to various processing operations, e.g., etching, selective deposition of materials, etc. Since the various mask layers used in manufacturing CMOS-based products typically only cover about half of the STI structures, the STI structures are subjected to different processing operations. As a result, undesirable divots are formed in STI structures in CMOS-based products.

Figure 1:
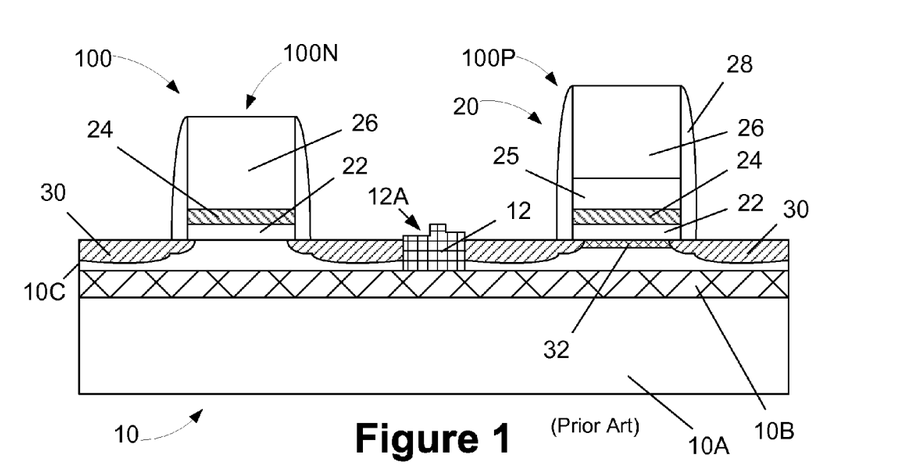
FIG. 1 is an illustrative example of a prior art CMOS-based semiconductor device.

FIG. 1 depicts an illustrative prior art CMOS-based device 100 that is generally comprised of a partially formed NFET transistor 100N and a partially formed PFET transistor 100P formed in and above a semiconducting substrate 10 comprised of silicon. The illustrative transistors 100N, 100P are separated by an STI structure 12 formed in the substrate 10, which was the first structure formed on the substrate 10. The substrate 10 may have a variety of configurations, such as the depicted silicon-on-insulator (SOI) structure having a bulk silicon layer 10A, a buried insulation layer 10B and an active layer 10C. The substrate 10 may also have a simple bulk silicon configuration. The STI structure 12 exhibits an uneven surface due to the presence of illustrative and simplistically depicted divots 12A that occur as a result of the many masking and etching processes performed on different regions of the device 100.

At the stage of manufacture depicted in FIG. 1, the transistors 100N, 100P are each comprised of a gate structure 20 and source/drain regions 30. The gate structure 20 may include a gate insulation layer 22, a high-k insulation layer 24, a gate electrode 26 and sidewall spacers 28. The gate electrode 26 may be made of one or more layers of a variety of conductive materials, such as lanthanum (for the NFET transistor 100N) and aluminum (for the PFET transistor 100P). In some cases, the PFET transistor 100P may have an additional work function layer 25, such as titanium nitride, that may not be present in the NFET transistor 100N. Typically, during the formation of the PFET transistor 100P, a layer of channel semiconductor material 32, e.g., silicon/germanium, is selectively formed on the active layer 10C in the P-active region where the PFET transistor 100P will be formed to enhance the performance of the PFET transistor 100P. Typically, such a layer of channel semiconductor material 32 is not formed for the NFET transistor 100N.

Prior to selectively forming the layer of channel semiconductor material 32 for the PFET transistor 100P only, the N-active region (where the NFET transistor 100N will be formed) and part of the STI structure 12 are masked, while the P-active region and the unmasked portion of the STI structure 12 will be exposed for further processing. In some cases, an etching process is performed to slightly recess the P-active region such that, after the channel semiconductor material 32 is formed, the upper surface of the channel semiconductor material 32 will be approximately level with the upper surface of the substrate in the N-active region. As mentioned above, the unmasked portion of the STI structure 12 will be exposed to this etching process and some of the material of the STI structure 12 will be consumed during this etching process, thereby creating an uneven upper surface on the STI structure 12.

The present disclosure is directed to various methods of forming semiconductor devices that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming semiconductor devices by forming semiconductor channel region materials prior to forming isolation structures, such as trench isolation structures. One example of a method disclosed herein for forming a transistor surrounded by an isolation structure includes the steps of, prior to forming the isolation structure, forming a semiconductor material on a region of a semiconducting substrate, after forming the semiconductor material, forming the isolation structure in the substrate around the semiconductor material, and forming a gate structure above the semiconductor material.

Another illustrative method disclosed herein is directed to forming first and second transistors above a semiconducting substrate wherein the first transistor is surrounded by a first isolation structure and the second transistor is surrounded by a second isolation structure. In this example, the method includes the steps of, prior to forming either of the first or second isolation structures, forming a semiconductor material on a first region of the semiconducting substrate where the first transistor will be formed, after forming the semiconductor material, forming the first and second isolation structures in the substrate, wherein the first isolation structure is formed around the semiconductor material and the second isolation structure is formed around a second region of the substrate where the second transistor will be formed, forming a first gate structure for the first transistor above the semiconductor material positioned on the first region of the substrate, and forming a second gate structure for the second transistor above the second region of the substrate. In one particular example, the first transistor is a PFET transistor, the second transistor is an NFET transistor and the semiconductor material is comprised of silicon/germanium.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to methods of forming semiconductor devices by forming semiconductor channel region materials prior to forming isolation structures, such as trench isolation structures. As will be readily apparent to those skilled in the art upon a complete reading of the present application, the present method is applicable to a variety of devices, including, but not limited to, logic devices, memory devices, etc., and to devices made using a variety of different technologies, e.g., NFET, PFET and CMOS technologies. With reference to the attached drawings, various illustrative embodiments of the methods and devices disclosed herein will now be described in more detail.

Figure 2A:
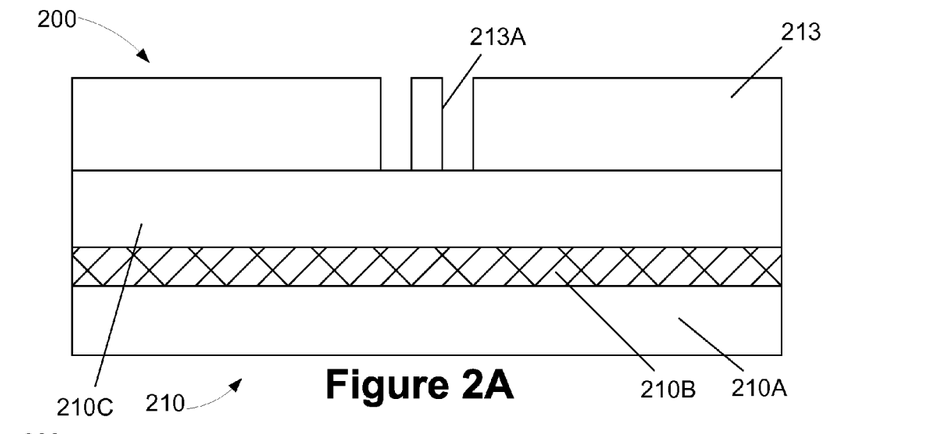
FIGS. 2A-2Q depict one illustrative method disclosed herein of forming semiconductor devices by forming semiconductor channel region materials prior to forming isolation structures.

FIG. 2A depicts an illustrative device 200 that is at an early stage of manufacture. The device 200 will be formed in and above an illustrative semiconducting substrate 210 that is a so-called silicon-on-insulator (SOI) substrate comprised of bulk silicon 210A, a buried insulation layer 210B (commonly referred to as a "BOX" layer) and an active layer 210C, which may also be a silicon material. Of course, the present invention is equally applicable to other configurations of the substrate 210. For example, the substrate 210 may be comprised of semiconducting materials other than silicon and/or it may be in another form, such as a bulk silicon configuration. Thus, the terms substrate or semiconductor substrate should be understood to cover all semiconductor structures. In the illustrative example depicted herein, when completed, the device 200 will include a plurality of illustrative NFET transistors that are formed in and above various N-active regions defined in the active layer of the substrate 210 and a plurality of illustrative PFET transistors that are formed in and above various P-active regions that are defined in the active layer of the substrate 210.

With continuing reference to FIG. 2A, a patterned etch mask layer 213 is formed above the substrate 210. The patterned etch mask layer 213 is comprised of a plurality of features 213A that correspond to alignment marks (discussed below) that will be formed in the active layer 210C of the substrate 210. The patterned etch mask layer 213 may be comprised of a variety of materials, e.g., photoresist, a hard mask material, etc. The patterned etch mask layer 213 may be formed by a variety of techniques, e.g., spin-coating, etc. In one illustrative embodiment, the patterned etch mask layer 213 is a layer of photoresist that is formed using traditional photolithography techniques, e.g., spin-on coating, soft-bake, exposure, hard bake and develop, etc.

Figure 2B:
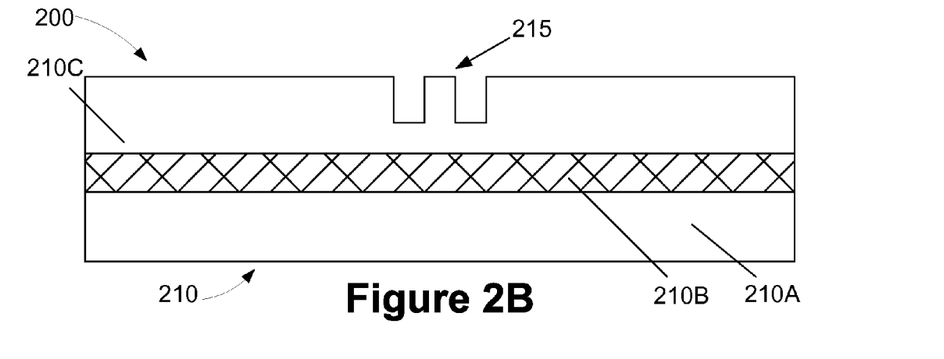

FIG. 2B depicts the device 200 after one or more etching processes have been performed through the patterned etch mask layer 213 (FIG. 2A) on the active layer 210C to define illustrative alignment marks 215 in the substrate 210 and the patterned etch mask layer 213 has been removed, e.g., by performing a plasma ashing process. The depicted alignment marks 215 are intended to be representative in nature in that they represent any type of alignment mark that may be employed in manufacturing semiconductor devices. The alignment marks 215 may be of any style or configuration (e.g., a cross, a chevron pattern, etc.) and the number and location of the alignment marks 215 may vary depending on the particular application and/or the device 200 under construction. For example, the alignment marks 215 may be located in the scribe lines (not shown) of the substrate 210 or they may be located on one or more of the die (not shown) that are on the substrate 210, or a combination of such locations. As one example, four of the illustrative alignment marks 215 may be provided for every "flash-field" that will be employed during photolithography operations. Thus, the presently disclosed inventions should not be considered as limited to any particular type, size, number or configuration of alignment marks 215, nor to the way such alignment marks 215 are made or positioned.

Figure 2C:
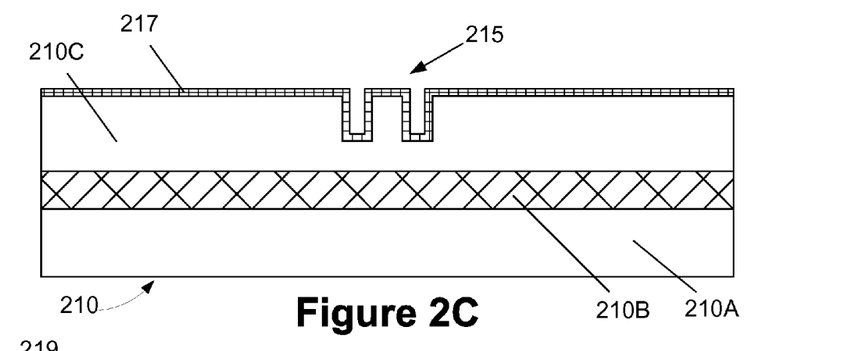

Next, as shown in FIG. 2C, a relatively thin layer of insulating material 217 is formed on the substrate 210 and in the alignment marks 215. In one illustrative embodiment, the layer of insulating material 217 is a layer of silicon dioxide having a thickness of about 10 nm that is formed by performing a thermal growth (oxidation) process. In some cases, the layer of insulating material 217 may be formed by performing a conformal deposition process, such as a chemical vapor deposition (CVD) or an atomic layer deposition (ALD) process.

Figure 2D:
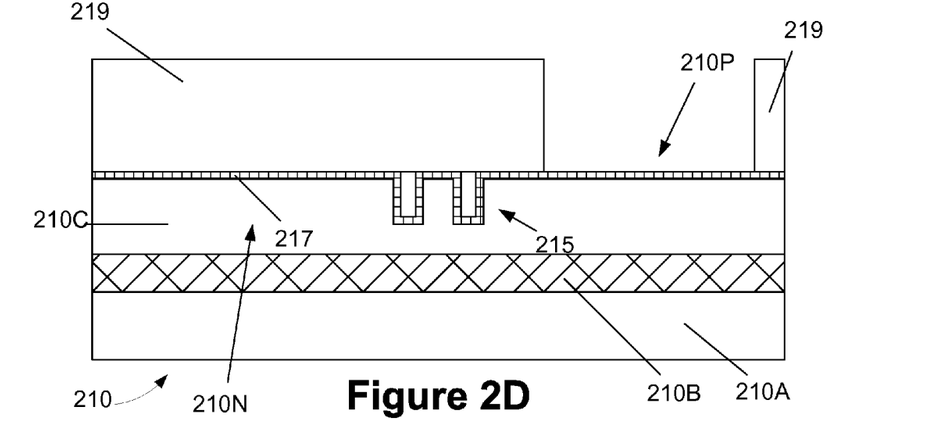

Then, as shown in FIG. 2D, a patterned etch mask layer 219 is formed above the layer of insulating material 217. The patterned etch mask layer 219 covers the alignment marks 215, but exposes portions of the layer of insulating material 217 that are positioned above regions of the substrate 210 where PFET transistors 210P will be formed. The patterned etch mask layer 219 covers portions of the layer of insulating material 217 that are positioned above regions of the substrate 210 where NFET transistors 210N will be formed. The patterned etch mask layer 219 may be comprised of a variety of materials, e.g., photoresist. The patterned etch mask layer 219 may be formed by a variety of techniques, e.g., spin-coating, etc. In one illustrative embodiment, the patterned etch mask layer 219 is a layer of photoresist that is formed using traditional photolithography techniques, e.g., spin-on coating, soft-bake, exposure, hard bake and develop, etc.

Figure 2E:
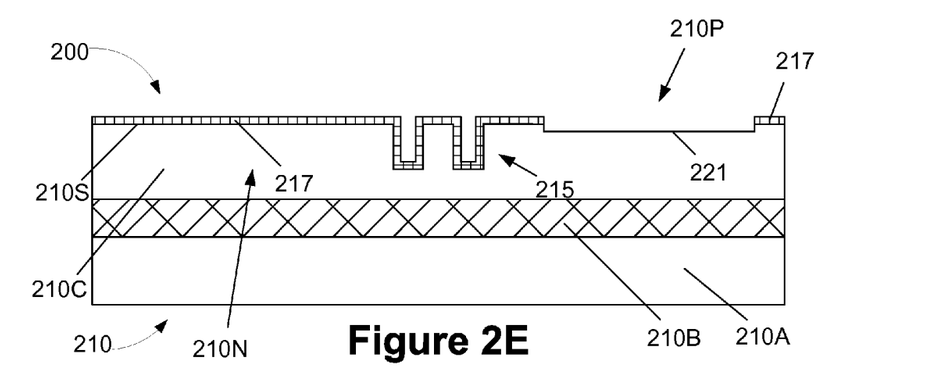

FIG. 2E depicts the device 200 after several process operations have been performed. First, one or more etching processes have been performed through the patterned etch mask layer 219 (FIG. 2D) on the exposed portions of the layer of insulating material 217 to pattern the insulating material 217, and the patterned etch mask layer 219 was then removed. Thereafter, another etching process was performed through the patterned insulating material 217 to define a recess 221 in the active layer 210C of the substrate 210. In one example, the recess 221 may have a depth of about 5-15 nm. The recess 221 is formed so that when a layer of channel semiconductor material (not shown in FIG. 2E) is formed in the recess 221 (as described more fully below), the upper surface of the channel semiconductor material will be approximately level with the upper surface 210S of the substrate 210 where the NFET transistors 210N will be formed. However, the formation of the recess 221 is optional and need not be formed in every application. FIG. 2E also shows the device 200 after the patterned etch mask layer 219 (FIG. 2D) has been removed, e.g., by performing a plasma ashing process.

Figure 2F:
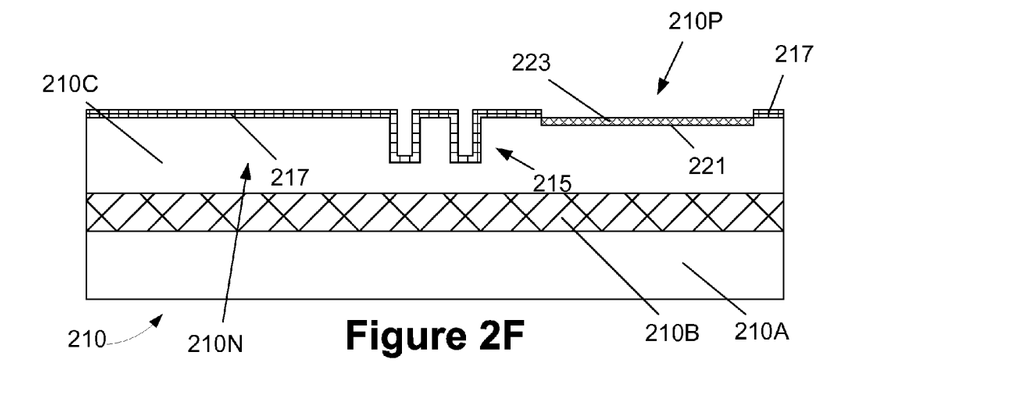

Next, as shown in FIG. 2F, a layer of semiconductor material 223 is selectively formed in the exposed recess 221. The process used to form the semiconductor material 223 is selective in that the semiconductor material 223 will be formed using a process such that the semiconductor material 223 only forms on regions where the active layer 210C is exposed, i.e., the semiconductor material 223 will not form on the layer of insulating material 217. The semiconductor material 223 may be comprised of a variety of different semiconductor materials, such as, for example, silicon/germanium, germanium, etc. Prior to forming the layer of semiconductor material 223, a pre-clean process may be performed to remove materials such as native oxides from the surface of the exposed substrate 210. The pre-clean process may be performed using, for example, HF in either a wet or dry etching process. The layer of semiconductor material 223 may be formed by a variety of techniques, e.g., by performing an epitaxial growth process in a deposition chamber using current day epitaxial deposition tools and techniques, etc. In one illustrative embodiment, the layer of semiconductor material 223 may be a layer of silicon/germanium having an as-deposited thickness of approximately 10 nm, and it may have a germanium concentration ranging from approximately 23-30% germanium as originally formed.

Figure 2G:
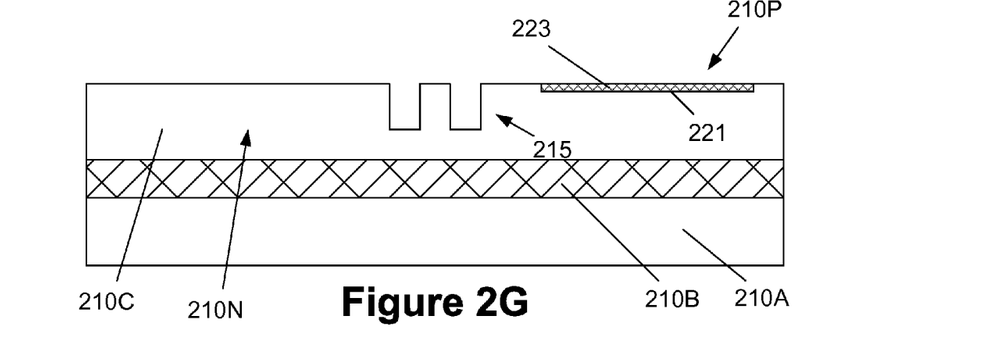

Next, as shown in FIG. 2G, an etching process, such as a wet etching process, is performed to remove the remaining portions of the layer of insulating material 217. This etching process should clear the layer of insulating material 217 from within the alignment marks 215.

Figure 2H:
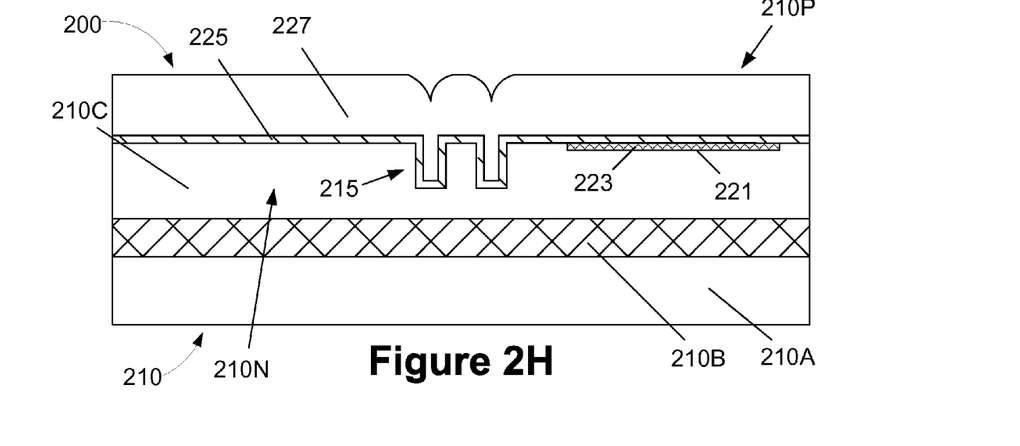

FIG. 2H depicts the device 200 after an illustrative pad oxide (silicon dioxide) layer 225 and an illustrative pad nitride (silicon nitride) layer 227 have been formed above the substrate 210. In one embodiment, both the pad oxide layer 225 and the pad nitride layer 227 fill the alignment marks 215. In one illustrative example, the pad oxide layer 225 may have a thickness on the order of about 5-10 nm, and it may be formed by performing a deposition process. In one illustrative example, the pad nitride layer 227 may have a thickness on the order of about 50-100 nm, and it may be formed by performing a chemical vapor deposition (CVD) process.

Figure 2I:
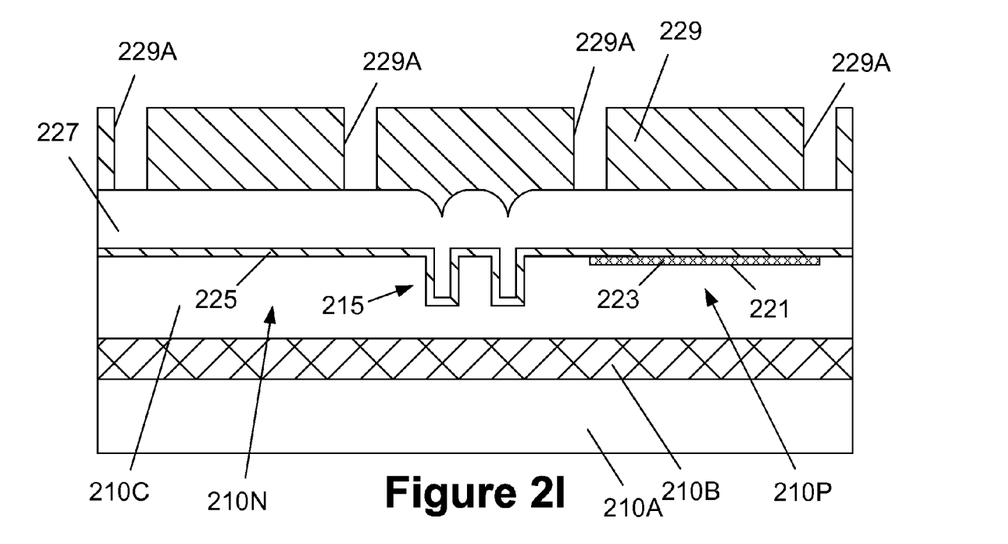

Next, as shown in FIG. 2I, a patterned etch mask layer 229 is formed above the pad nitride layer 227. The patterned etch mask layer 229 is comprised of a plurality of features 229A that correspond to where trenches will be formed in the active layer 210C for shallow trench isolation structures, as described more fully below. The patterned etch mask layer 229 may be comprised of a variety of materials, e.g., photoresist, a hard mask material, etc. The patterned etch mask layer 229 may be formed by a variety of techniques, e.g., spin-coating, etc. In one illustrative embodiment, the patterned etch mask layer 229 is a layer of photoresist that is formed using traditional photolithography techniques, e.g., spin-on coating, soft-bake, exposure, hard bake and develop, etc.

Figure 2J:
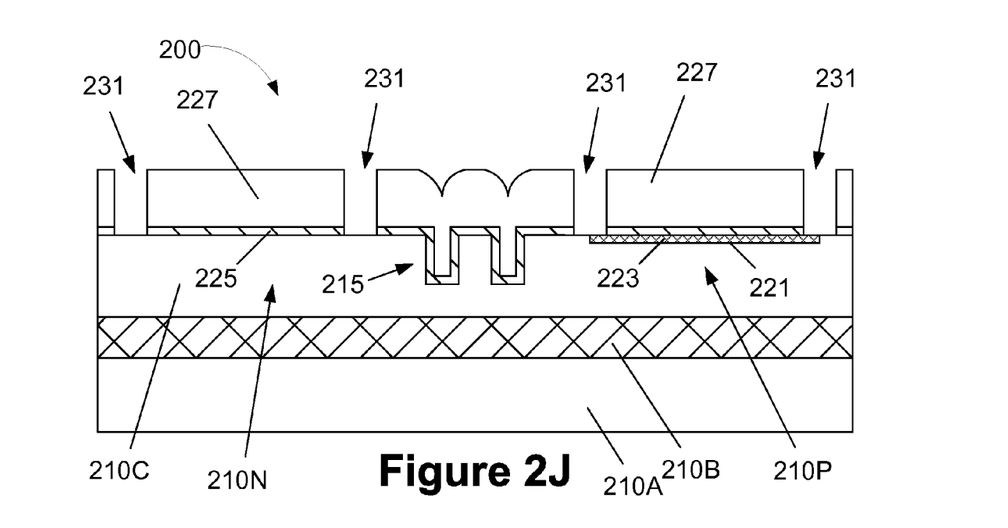

FIG. 2J depicts the device 200 after several process operations have been performed. First, one or more etching processes have been performed through the patterned etch mask layer 229 (FIG. 2I) on the exposed portions of the pad nitride layer 227 and the pad oxide layer 225 to thereby form a plurality of openings 231 that expose portions of the active layer 210C. FIG. 2J also shows the device 200 after the patterned etch mask layer 229 has been removed, e.g., by performing a plasma ashing process.

Figure 2K:
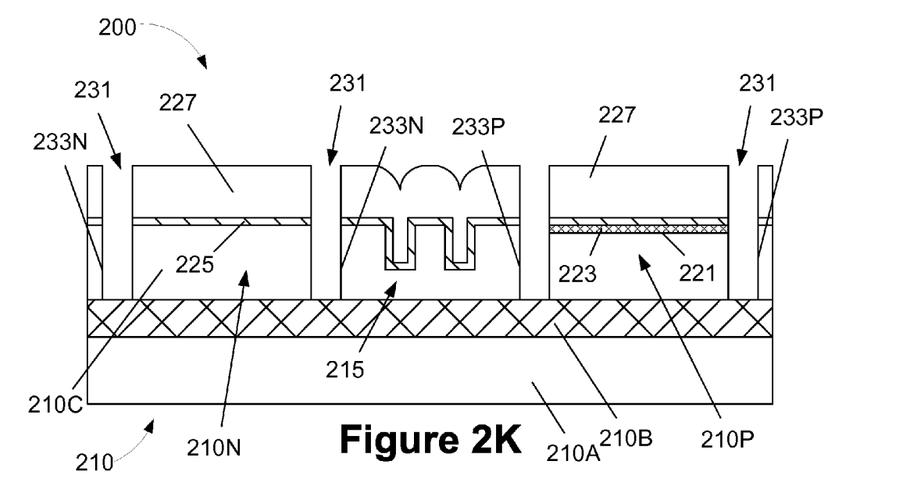

FIG. 2K depicts the device 200 after a common etching process, such as a reactive ion etching process, has been performed on the substrate 210 through the openings 231 in the combination of the pad nitride layer 227/pad oxide layer 225 to thereby define a plurality of trenches in the active layer 210C. For future reference, the trenches have been labeled as 233N and 233P to reflect that the particular trench is associated with the NFET transistor 210N and the PFET transistor 210P, respectively. The first trench 233P surrounds the semiconductor material 223 where the PFET transistor 210P will be formed, while the second trench 233N surrounds a region of the substrate where the NFET transistor 210N will be formed. In the depicted example, the trenches 233N, 233P extend down to the underlying BOX layer 210B, although that may not be the case in all applications. For ease of illustration, the trenches 233N, 233P are depicted as having a generally rectangular cross-section. In real-world devices, the sidewalls of the trenches 233N, 233P will likely be somewhat inwardly tapered. The dimensions of the trenches 233N, 233P may vary depending on the particular application. In current day devices, the trenches 233N, 233P may have a depth of about 100-400 nm and a width (at the top of the trench) of about 30-1000 (or even more) nm.

Figure 2L:
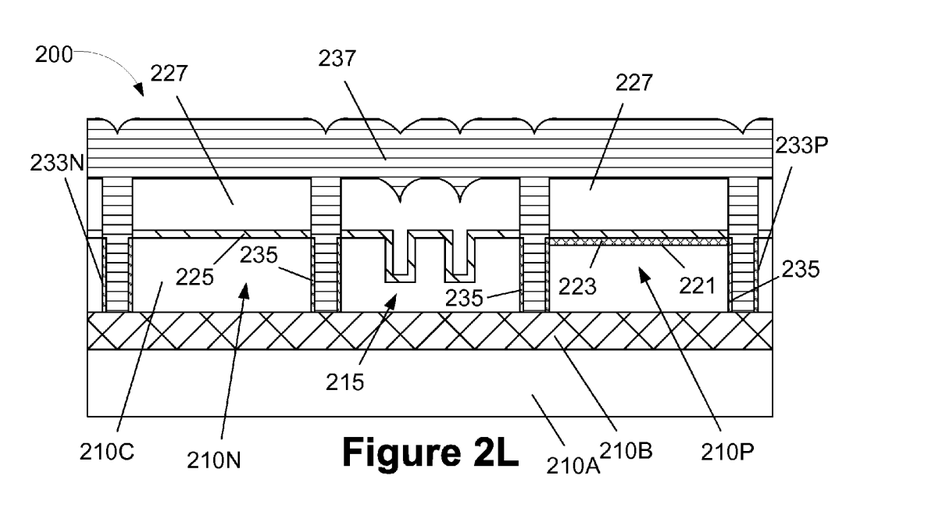

FIG. 2L depicts the device 200 after several process operations have been performed. First, the device 200 is exposed to an oxidizing ambient to form a layer of silicon dioxide 235 on the exposed silicon surfaces within the trenches 233N, 233P. The duration of the exposure to the oxidizing ambient and conditions of the oxidation process may vary depending upon a variety of factors. In one illustrative example, the oxidation process may be performed in any acceptable process tool, e.g., a furnace, at a temperature ranging from 750-1100° C. for a duration of approximately 5-1000 seconds. In one illustrative example, the layer of silicon dioxide 235 may have a thickness ranging from approximately 2-5 nm. Next, a layer of insulating material 237 is formed above the pad nitride layer 227 and overfills the openings as depicted. The layer of insulating material 237 may be comprised of a variety of different insulating materials, such as silicon dioxide, silicon oxycarbide, etc. The layer of insulating material 237 may be formed using a variety of techniques, e.g., a HDP (High Density Plasma) oxide process, a HARP (High Aspect Ratio Process) oxide process, a chemical vapor deposition (CVD), an atomic layer deposition (ALD), etc., or plasma-enhanced versions of those processes. In one illustrative example, the layer of insulating material 227 is a layer of silicon dioxide that is formed by performing a CVD process.

Figure 2M:
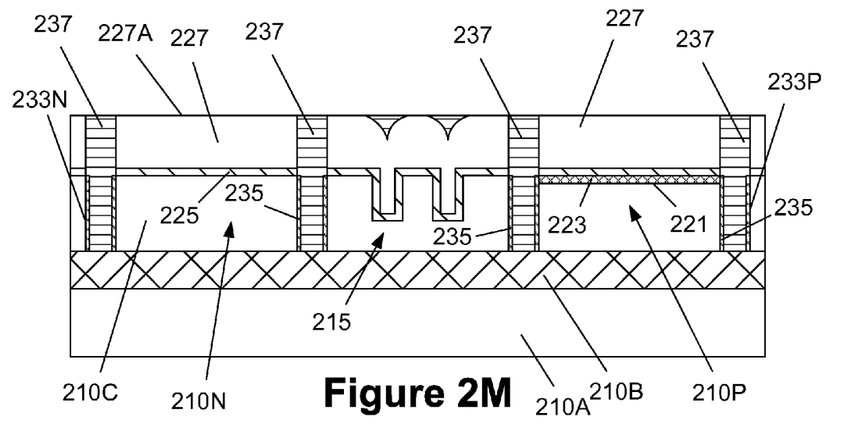

Next, as shown in FIG. 2M, one or more CMP processes are performed to remove the portions of the layer of insulating material 237 that are positioned above the upper surface 227A of the pad nitride layer 227.

Figure 2N:
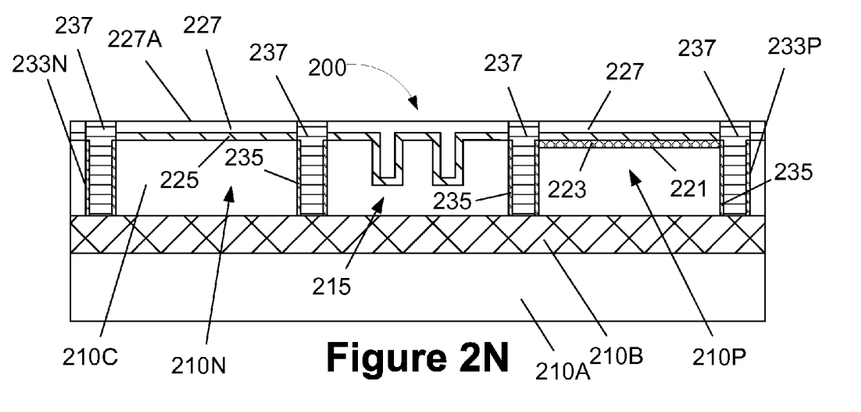

Thereafter, as shown in FIG. 2N, in one illustrative embodiment, a non-selective plasma-based etching process is performed to remove significant portions of the pad nitride layer 227 and the layer of insulating material 237. The non-selective etching process etches silicon nitride and silicon dioxide at similar etch rates. The non-selective etching process can also be used to determine, as least in part, the final height of the final trench isolation structures for the device 200.

Figure 2O:
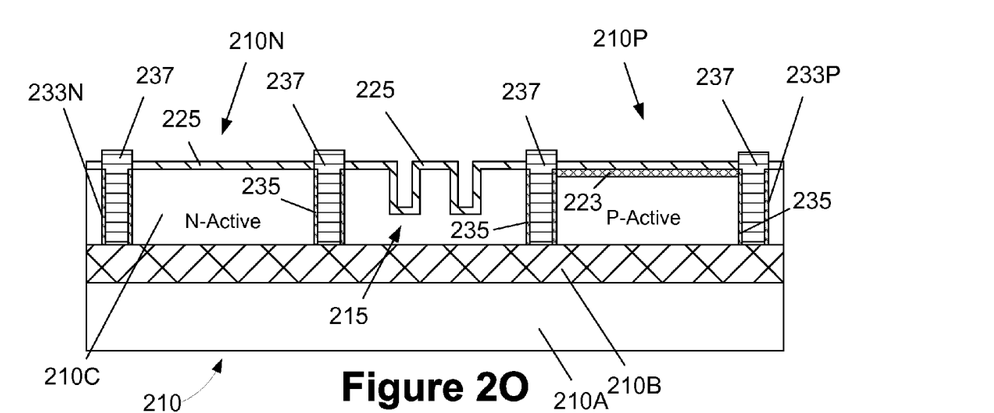

Then, as shown in FIG. 2O, one or more etching processes, e.g., a wet etching process using hot phosphoric acid, is performed to remove the pad nitride layer 227 (FIG. 2N) leaving the pad oxide layer 225 in place. In one embodiment, if desired, various ion implantation processes may be performed through the pad oxide layer 225 to form various doped regions in the substrate 210, e.g., N-wells, P-well, halo implant regions, etc. Such ion implant processes are typically performed through patterned implant masks (not show), such as photoresist masks, that expose selective portions of the substrate 210 while protecting other portions of the substrate 210 from such ion implantation processes, as is well known to those skilled in the art. Of course, if desired, the pad oxide layer 225 may be removed at this time by performing a quick wet etching process using a dilute HF chemistry.

Figure 2P:
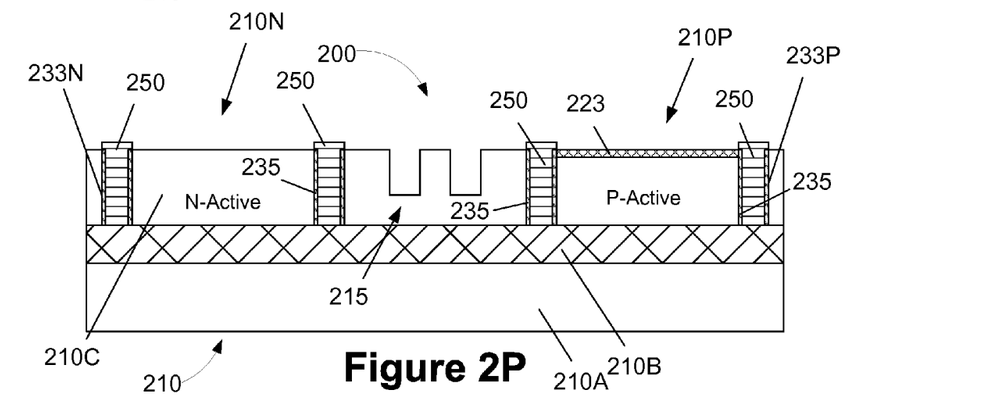

FIG. 2P depicts the device 200 after the pad oxide layer 225 (FIG. 2O) has been removed by performing an etching process using a dilute HF acid chemistry. As part of this etching process, the final step height of the two final isolation structures 250 is fixed. Accordingly, the methods disclosed herein provide a technique for forming isolation structures 250 having a highly uniform topography at this point in the process flow, e.g., prior to gate formation operations. More specifically, in contrast to the prior art method disclosed in the background section of this application, by forming the semiconductor material 223 for the PFET devices 210P prior to forming the isolation structures 250 using the novel methods described herein, one of the major sources of divot formation in isolation structures is eliminated. As a result, the topography across the P-active and N-active regions of the substrate 210 is more uniform than the topography of prior art devices.

Figure 2Q:
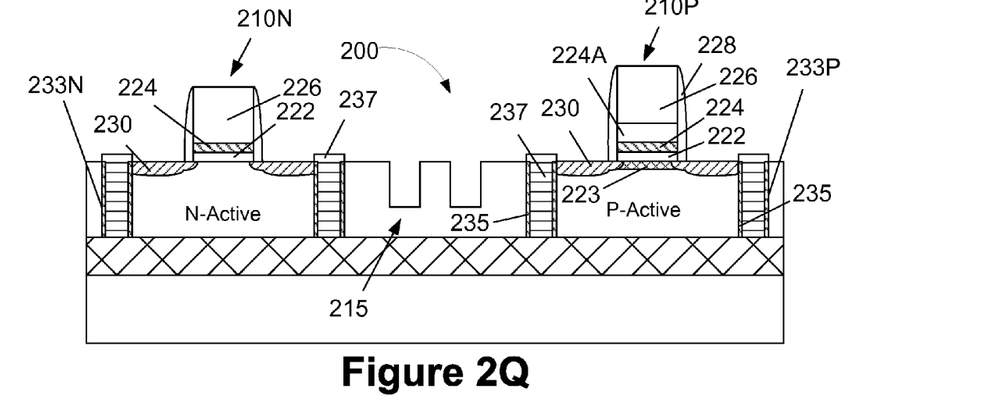

At the point of fabrication depicted in FIG. 2P, traditional processing operations may be performed to complete the formation of the transistors 210N, 210P. For example, FIG. 2Q depicts the device 200 after many process operations have been performed to form the basic transistor structures. As shown therein, the NFET transistor 210N and the PFET transistor 210P are each comprised of a gate structure and source/drain regions 230. The gate structure may include a gate insulation layer 222, a high-k insulation layer 224, a gate electrode 226 and sidewall spacers 228. The gate electrode 226 may be made of one or more layers of a variety of conductive materials, such as lanthanum (for the NFET transistor 210N) and aluminum (for the PFET transistor 210P). In some cases, the PFET transistor 210P may have an additional work function layer 224A, such as titanium nitride, that may not be present in the NFET transistor 210N. As depicted, the PFET transistor 210P also has the layer of channel semiconductor material 223, e.g., silicon/germanium, which is not formed for the NFET transistor 210N.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor surrounded by an isolation structure, the method comprising:
   prior to forming said isolation structure, forming a semiconductor material on a first exposed region of a semiconducting substrate while covering a second region of said substrate;
   after forming said semiconductor material, forming at least one pad layer above said second region of said substrate and said semiconductor material positioned above said first region of said substrate, wherein said at least one pad layer is comprised of an insulating material;
   forming a trench that extends through said at least one pad layer and into said substrate, wherein said trench extends around said first region of said semiconductor material;
   forming said isolation structure in said trench around said first region of said semiconductor material; and
   forming a gate structure above said first region of said semiconductor material.

2. The method of claim 1, wherein forming said semiconductor material comprises performing an epitaxial deposition process to form a semiconductor material comprised of silicon/germanium or germanium on said exposed region of said semiconducting substrate.

3. The method of claim 1, wherein said semiconducting substrate is a bulk semiconducting substrate or an active layer of a silicon-on-insulator (SOI) substrate.

4. The method of claim 1, wherein said transistor is a PFET transistor and wherein said semiconductor material is comprised of silicon/germanium.

5. The method of claim 1, wherein, prior to forming said semiconductor material on said exposed first region of said substrate, the method further comprises forming at least one alignment mark in said semiconducting substrate.

6. The method of claim 1, wherein, prior to forming said semiconductor material on said exposed region of said substrate, the method further comprises forming a recess in said substrate and wherein selectively forming said semiconductor material comprises selectively forming said semiconductor material in said recess.

7. The method of claim 1, wherein said isolation structure is a shallow trench isolation structure.

8. The method of claim 1, wherein said gate structure is either a sacrificial gate structure or a final gate structure for said transistor.

9. The method of claim 1, wherein said gate structure is comprised of at least a gate insulation layer and a conductive gate electrode.

10. A method of forming a PFET transistor surrounded by an isolation structure, the method comprising:
    prior to forming said isolation structure, performing an epitaxial deposition process to form a semiconductor material comprised of silicon/germanium or germanium on a first exposed region of a semiconducting substrate while covering a second region of said substrate;
    after forming said semiconductor material, forming at least one pad layer above said second region of said substrate and said semiconductor material positioned above said first region of said substrate, wherein said at least one pad layer is comprised of an insulating material;
    forming a trench that extends through said at least one pad layer and into said substrate, wherein said trench extends around said first region of said semiconductor material;
    forming said isolation structure in said trench around said first region of said semiconductor material; and
    forming a gate structure above said first region of said semiconductor material.

11. The method of claim 10, wherein, prior to performing said epitaxial deposition process to form said semiconductor material on said first exposed region of said substrate, the method further comprises forming at least one alignment mark in said semiconducting substrate.

12. The method of claim 10, wherein, prior to performing said epitaxial deposition process to form said semiconductor material on said exposed first region of said substrate, the method further comprises forming a recess in said substrate and wherein performing said epitaxial deposition process to selectively form said semiconductor material comprises performing said epitaxial deposition process to selectively form said semiconductor material in said recess.

13. A method of forming a first transistor surrounded by a first isolation structure and a second transistor surrounded by a second isolation structure, the method comprising:
    prior to forming either of said first or second isolation structures, forming a semiconductor material on an exposed first region of a semiconducting substrate where said first transistor will be formed;
    after forming said semiconductor material, forming at least one pad layer above a second active region of said substrate and above said semiconductor material, wherein said at least one pad layer is comprised of an insulating material;
    forming first and second trenches that extend through said at least one pad layer and into said substrate, wherein said first trench is formed around said semiconductor material positioned in said first active region of said substrate and said second trench is formed around said second region of said substrate where said second transistor will be formed;

forming said first and second isolation structures in said first and second trenches, respectively;

forming a first gate structure for said first transistor above said semiconductor material positioned on said first region of said substrate; and forming a second gate structure for said second transistor above said second region of said substrate.

14. The method of claim 13, wherein forming said semiconductor material comprises performing an epitaxial deposition process to form a semiconductor material comprised of silicon/germanium or germanium on said first region of said semiconducting substrate.

15. The method of claim 13, wherein said first transistor is a PFET transistor, said second transistor is an NFET transistor and wherein said semiconductor material is comprised of silicon/germanium.

16. The method of claim 13, wherein, prior to forming said semiconductor material on said exposed first region of said substrate, the method further comprises forming at least one alignment mark in said semiconducting substrate.

17. The method of claim 13, wherein, prior to forming said semiconductor material on said exposed first region of said substrate, the method further comprises forming a recess in said substrate and wherein forming said semiconductor material comprises forming said semiconductor material in said recess.

18. The method of claim 13, wherein forming said first and second trenches comprises performing a common etching process to define said first trench and said second trench.

19. A method of forming a PFET transistor surrounded by a first isolation structure and an NFET transistor surrounded by a second isolation structure, the method comprising:

prior to forming either of said first or second isolation structures, performing an epitaxial deposition process to form a semiconductor material comprised of silicon/germanium or germanium on an exposed first region of a semiconducting substrate where said PFET transistor will be formed while covering a second region of said substrate where said NFET transistor will be formed;

after forming said semiconductor material on said exposed first region of said substrate, forming at least one pad layer above said substrate and said semiconductor material, wherein said at least one pad layer is comprised of an insulating material;

forming first and second trenches that extend through said at least one pad layer and into said substrate, wherein said first trench is formed around said semiconductor material and said second trench is formed around said second region of said substrate where said NFET transistor will be formed;

forming said first and second isolation structures in said first and second trenches, respectively;

forming a first gate structure for said PFET transistor above said semiconductor material positioned on said first region of said substrate; and forming a second gate structure for said NFET transistor above said second region of said substrate.

20. The method of claim 19, wherein, prior to performing said epitaxial deposition process to form said semiconductor material on said exposed first region of said substrate, the method further comprises forming at least one alignment mark in said semiconducting substrate.

21. The method of claim 19, wherein, prior to performing said epitaxial deposition process to form said semiconductor material on said exposed first region of said substrate, the method further comprises forming a recess in said substrate and wherein forming said semiconductor material comprises forming said semiconductor material in said recess.

22. The method of claim 19, wherein forming said first and second trenches in said substrate comprises performing a common etching process to define said first trench and said second trench.

23. A method of forming a first transistor surrounded by a first isolation structure and a second transistor surrounded by a second isolation structure, the method comprising:

prior to forming either of said first or second isolation structures, forming at least one alignment mark in a semiconducting substrate;

after forming said at least one alignment mark, forming a patterned layer of insulating material above said substrate wherein said patterned layer of insulating material exposes a first region of said semiconducting substrate where said first transistor will be formed while covering a second region of said substrate where said second transistor will be formed;

forming a semiconductor material on said exposed first region of said substrate while said second region of said substrate is covered;

after forming said semiconductor material, removing said patterned layer of insulating material and forming at least one pad layer above said substrate and said semiconductor material, wherein said at least one pad layer is comprised of an insulating material;

forming first and second trenches that extend through said at least one pad layer and into said substrate, wherein said first trench is formed around said semiconductor material and said second trench is formed around said second region of said substrate where said second transistor will be formed;

forming said first and second isolation structures in said first and second trenches, respectively;

forming a first gate structure for said first transistor above said semiconductor material positioned on said first region of said substrate; and forming a second gate structure for said second transistor above said second region of said substrate.

24. The method of claim 23, wherein forming said semiconductor material comprises performing an epitaxial deposition process to form a semiconductor material comprised of silicon/germanium or germanium on said first region of said semiconducting substrate.

25. The method of claim 23, wherein said first transistor is a PFET transistor, said second transistor is an NFET transistor and wherein said semiconductor material is comprised of silicon/germanium.

26. The method of claim 23, wherein, prior to forming said semiconductor material on said first region of said substrate, the method further comprises forming a recess in said substrate and wherein forming said semiconductor material comprises forming said semiconductor material in said recess.

27. The method of claim 23, wherein forming said first and second trenches comprises performing a common etching process to define said first trench and said second trench.

* * * * *